United States Patent [19]

Hashimoto et al.

[11] Patent Number: 5,306,601
[45] Date of Patent: Apr. 26, 1994

[54] FINE PATTERN FORMING MATERIAL AND PATTERN FORMING METHOD

[75] Inventors: Kazuhiko Hashimoto, Moriguchi; Taichi Koizumi, Osaka; Kenji Kawakita, Neyagawa; Noboru Nomura, Kyoto, all of Japan

[73] Assignee: Matsushita Electric Industrial Co., Ltd., Osaka, Japan

[21] Appl. No.: 93,032

[22] Filed: Jul. 19, 1993

Related U.S. Application Data

[60] Continuation of Ser. No. 656,692, Feb. 19, 1991, abandoned, which is a division of Ser. No. 371,251, Jun. 26, 1989, abandoned.

Foreign Application Priority Data

Jun. 29, 1988 [JP] Japan ................ 63-161640
Jun. 29, 1988 [JP] Japan ................ 63-161644

[51] Int. Cl.$^5$ ................................ G03C 5/00
[52] U.S. Cl. .................... 430/296; 430/313; 430/317; 430/323; 430/325; 430/330; 430/942; 250/492.1; 250/492.2; 250/492.3
[58] Field of Search ............ 430/5, 296, 313, 315, 430/317, 322, 323, 324, 325, 330, 942; 250/492.1, 492.2, 492.3

[56] References Cited

U.S. PATENT DOCUMENTS

| | | | |
|---|---|---|---|
| 4,266,004 | 5/1981 | Kern | 430/269 |
| 4,521,589 | 6/1985 | Yamamoto | 528/380 |
| 4,711,742 | 12/1987 | Jen | 252/500 |
| 4,737,557 | 4/1988 | Sato . | |
| 4,985,319 | 1/1991 | Watakabe | 430/296 |
| 5,051,338 | 9/1991 | Kato | 430/296 |

FOREIGN PATENT DOCUMENTS

| | | |
|---|---|---|
| 2016016 | 4/1970 | Fed. Rep. of Germany . |
| 59-53837 | 7/1984 | Japan . |
| 62-139547 | 6/1987 | Japan . |

OTHER PUBLICATIONS

Fredericks: IBM Technical Disclosure Bulletin 20(4), Sep. 1977, p. 1444.
Todokoro: International Electron Devices Meeting Dec. 1977, pp. 753–756.
Elliot: "Integrated Circuit Fabrication Technology" 1982, p. 27.
Chemical Abstracts, vol. 108, No. 24, Jun. 13th, 1988, p. 619, abstract No. 21367r, Columbus, Ohio, US; K. Yoshino et al.: "Spectral change of polymer film containing poly(3-alkylthiophene) with temperature and its application as optical recording media", & Jpn. J. Appl. Phys., Part 2, 1988, 27(3), L454–L456.
Chemical Abstracts, vol. 93, No. 3, Aug. 1980, p. 767, abstract No. 58156s, Columbus, Ohio, US; H. Tanaka et al.: "Synthesis of polymers containing sulfide bonds in the main chain and application as positive type resist", & Kobunishi Ronbunshu 1989, 37(4), 269–74.
Patent Abstracts of Japan, vol. 8, No. 157 (P-288)(1594), Jul. 29th, 1984; & JP-A-59 053 837 (Nippon Denshin Kosha) Mar. 28, 1984.

Primary Examiner—Marion E. Mc Camish
Assistant Examiner—Kathleen Duda
Attorney, Agent, or Firm—Stevens, Davis, Miller & Mosher

[57] ABSTRACT

Herein is provided a fine pattern forming method which is prevented from the charging-up phenomenon at the time of electric charged beam writing owing to the use of a polyalkylthiophene type conductive polymeric substance or a quaternary ammonium ion type polymeric substance in a monolayer or multilayer resist.

4 Claims, 7 Drawing Sheets

FIELD BUTTING

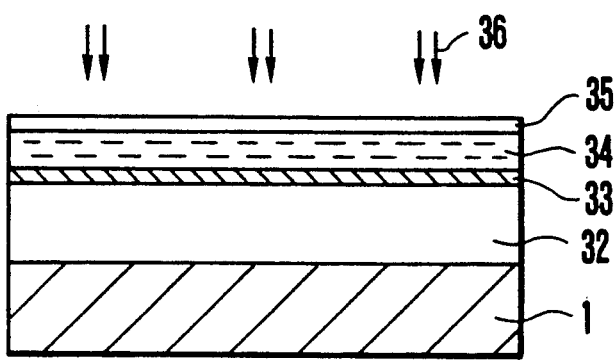
F I G. 4 (a)
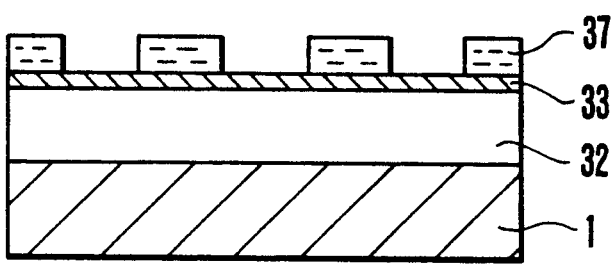
F I G. 4 (b)
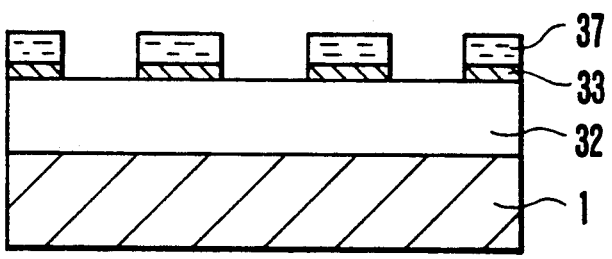
F I G. 4 (c)
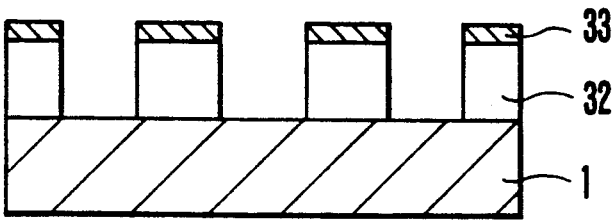
F I G. 4 (d)

FINE PATTERN FORMING MATERIAL AND PATTERN FORMING METHOD

This application is a continuation of application Ser. No. 07/656,692, filed Feb. 19, 1991; which in turn is a division of application Ser. No. 07/371,251, filed Jun. 26, 1989 both now abandoned.

BACKGROUND OF THE INVENTION

1. Field of the Invention

This invention relates to a fine pattern forming material used for forming a pattern by the method of electric charged beam direct writing using electron beam or focused ion beam and thereby producing semiconductor devices or integrated circuits, as well as to a pattern forming method using said material.

2. Description of Prior Art

Hitherto, in the production of IC, LSI, etc., pattern forming has been carried out by photo lithography using ultraviolet rays. As the devices become finer, numerical aperture of stepper lens is becoming higher and the wavelength of light source is becoming shorter. However, these means are disadvantageous in that they bring about a smaller focus depth. Further, the adoption of finer pattern dimension of LSI devices and the production of ASIC have become promoting the use of electron beam lithography. For the fine pattern forming by electron beam lithography, positive type electron beam resist has an indispensable necessity. Although polymethyl methacrylate (PMMA) is known to have the highest resolving power among the positive type electron beam resists, it is disadvantageous in that its sensitivity is low. Thus, a numner of studies have been reported in the recent years concerning the method for improving positive type electron beam resist in sensitivity. For example, positive type electron beam resists made of polybutyl methacrylate, methyl methacrylate-methacrylic acid copolymer, methacrylic acid-acrylonitrile copolymer, methyl methacrylate-isobutylene copolymer, polybutene-1-sulfone, polyisopropenyl ketone, fluoro polymethacrylate, and the like have been disclosed. In all these types of resists, an electron withdrawing group is introduced into the side chain or a readily decomposable group is introduced in the principal chain in order to facilitate the scission of principal chain upon exposure to electron beams and thereby to improve the sensitivity. However, they have a problem that they are poor in dry etch resistance, they are readily influenced by the charging-up phenomenon because of its insulating character, and they are apt to be contaminated by organic solvent developer. Further, electron beam lithography is disadvantageous in that accuracy of pattern can be deteriorated by the proximity effect due to the forward and back scatterings of electron. From the viewpoint of overcoming these disadvantages, the multi-layer resist process wherein the function of resist is divided into that of pattern forming layer and that of planerizing layer is effective. FIGS. 6(a)-6(d) illustrates a multi-layer resist process in the electron beam lithography. An organic film having a thickness of 2 to 3 microns is formed as a bottom layer 51 for suppressing the proximity effect, on which an inorganic film of $SiO_2$ or the like or SOG (spin on glass) is coated as an intermediate layer 52 and, as a top layer, an electron beam resist 53 is coated. Further thereon, an aluminum film 54 is formed by vapor deposition up to a thickness of about 100 angstroms in order to prevent charging-up (FIG. 6(a)). After exposure to light, the aluminum film 54 is removed with an alkaline solution, after which development is carried out (FIG. 6(b)). Then, using this resist pattern as a mask, dry etching of intermediate layer 52 is carried out (FIG. 6(c)). Next, bottom layer 51 is dry-etched, using the intermediate layer as a mask (FIG. 6(d)). By the above-mentioned multi-layer resist process, a fine pattern can be formed at a high aspect ratio. However, in a multi-layer resist prepared by vapor deposition of aluminum, the process is not practical because the process is more complicated and it involves the problem of contamination.

PROBLEMS TO BE SOLVED BY THE INVENTION

As has been mentioned above, multi-layer resist process with aluminum film is disadvantageous because of complexity of the process and problem of contamination, though it is an effective process. On the other hand, a multi-layer process using no aluminum film has the problem of charging-up. The term "charging-up" used herein means a phenomenon that the incident electron is accumulated in the insulator, i.e. resist, intermediate layer or bottom layer. Due to this charging-up phenomenon, important problems such as field butting, deterioration in overlay accuracy, etc. arise in the electron beam lithography. This charging-up phenomenon appears in single layer resist, too, where it causes field butting and deterioration in overlay accuracy similarly to the case of tri-layer resist.

FIG. 7 is a surface SEM photograph of a pattern formed by tri-layer resist process without aluminum film. Due to the charging-up phenomenon, a field butting error appears and breakage of pattern is observed. In case of tri-layer resist, too, this type of breakage of pattern occurs if aluminum film is not present. That is, in the electron beam exposure, region A is scanned with electron beam in the direction of arrow, and thereafter region B is scanned in the direction of arrow. If charging-up takes place at this time, breakage of line (field butting error) appears at the boundary between regions A and B in the resist pattern after development. Originally, the resist patterns in regions A and B must be continuous.

That is, in electron beam lithography, the incident electron scatters in the resist while losing its energy and stops at a depth of 1–1.5 microns as measured from the resist surface, so that the charge is accumulated there. The accumulated charge deviates the direction of electron beam and thereby causes a deterioration of the overlay accuracy.

SUMMARY OF THE INVENTION

The object of this invention consists in providing a material for use in the charged beam (e.g. electron beam or focused ion beam) direct writing method using a single layer or multi-layer resist with which the charging-up caused by electron or electric charged particle can be prevented and an accurate fine resist pattern can be formed, as well as a method using said material.

In order to achieve the above-mentioned object, the fine pattern forming material and the pattern forming method of this invention use a polyalkylthiophene type conductive polymer material or a quaternary ammonium ion type ion conductive polymer material, by which an arbitrary accurate fine resist pattern can be formed without pattern distortion due to charging-up at the time of writing.

BRIEF DESCRIPTION OF THE DRAWINGS

FIGS. 4(a)-4(d) is a sectional view illustrating the process of Example 9;

Figure 1A:
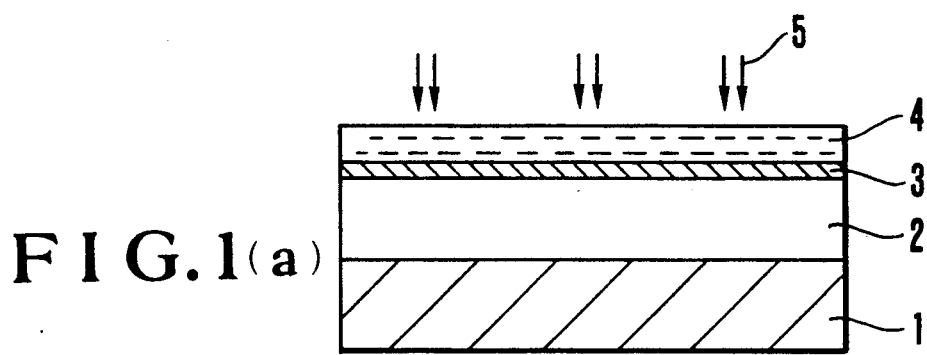
FIGS. 1(a)-1(d) is a sectional view illustrating the process of Example 5 of this invention.
Figure 1B:
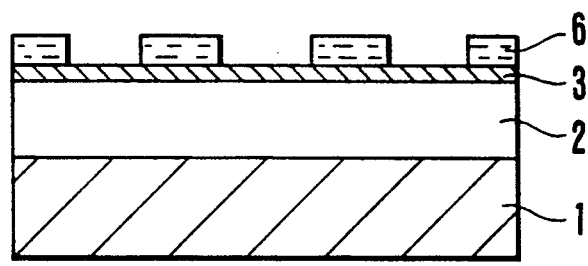
Figure 1C:
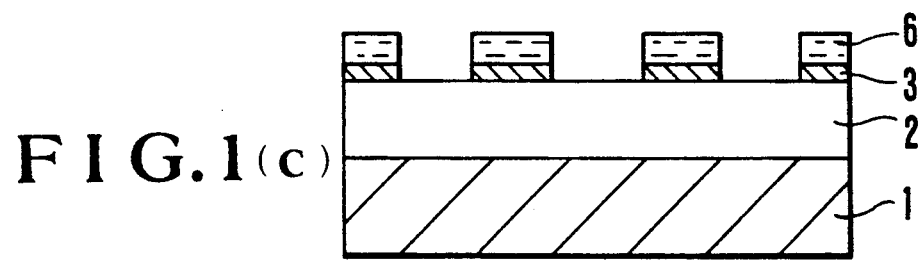
Figure 1D:
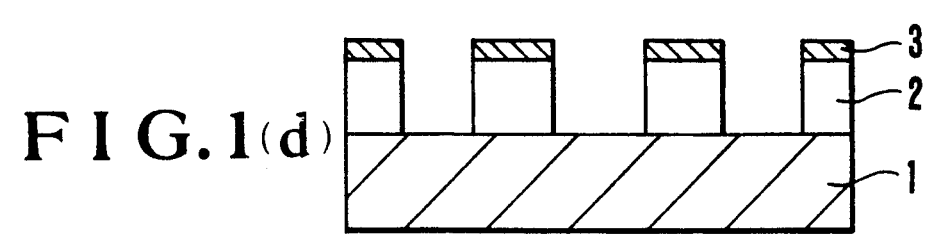
Figure 2A:
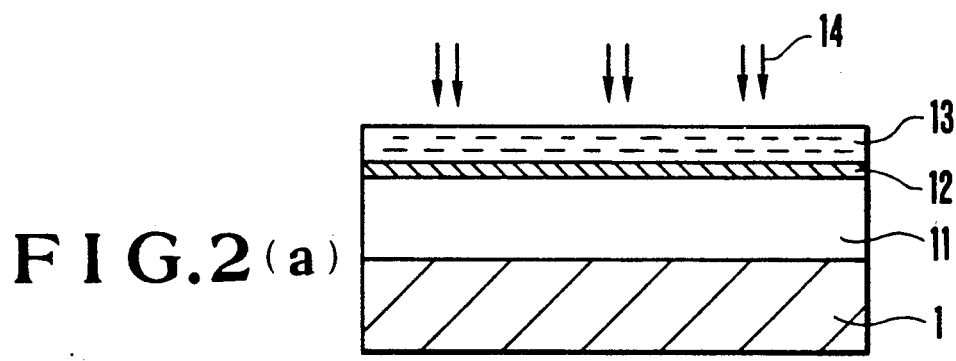
FIGS. 2(a)-2(d) is a sectional view illustrating the process of Example 6.
Figure 2B:
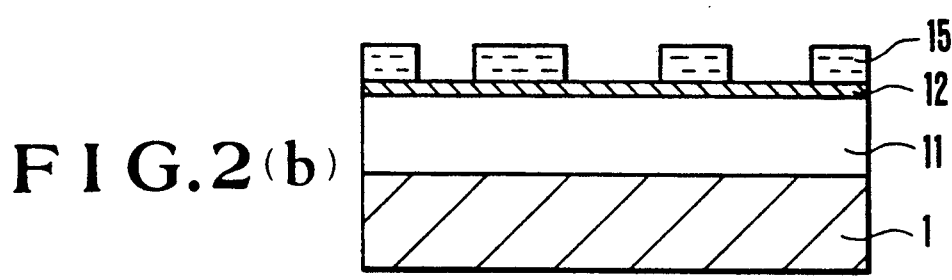
Figure 2C:
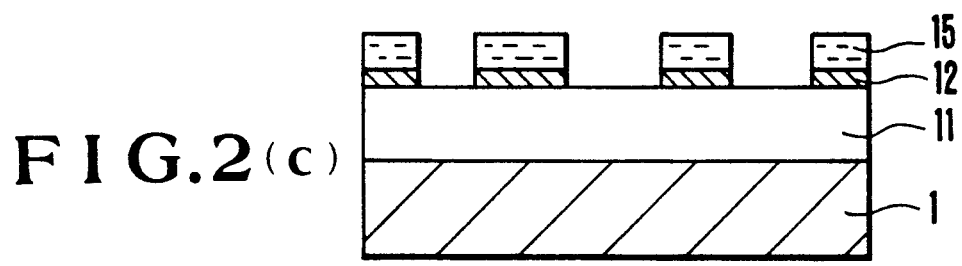
Figure 2D:
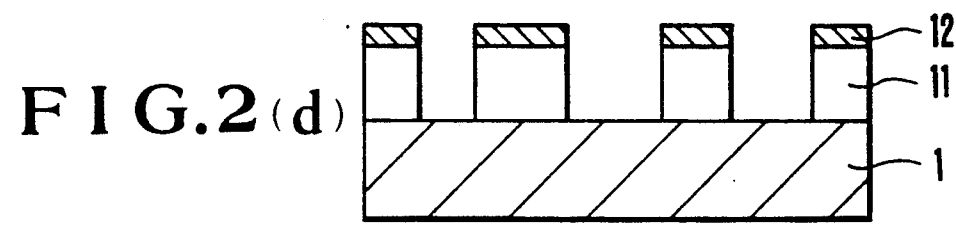

1—semiconductor substrate,
2—bottom layer film,
3—SOG,
4—electron beam resist,
5—electron beam,
6—resist pattern,
11—polymer organic film,
12—SOG,
13—electron beam resist,
14—electron gun,
15—resist pattern,
32—bottom layer plate,
33—SOG,
34—electron beam resist,
35—polymer organic film,
36—electron beam,
37—resist pattern,
41—polymer organic film,
42—SOG,
43—electron beam resist,
44—electron beam,
45—resist pattern,
51—bottom layer,
52—intermediate layer,
53—electron beam resist,
54—aluminum film,
55—electron beam,
56—resist pattern.

DETAILED DESCRIPTION OF THE INVENTION

Since a polyalkylthiophene type polymeric substance (I) represented by the following general formula:

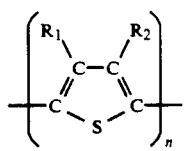

($R_1$ and $R_2$ both represent identical or different alkyl group or $R_1$ represents alkyl group and $R_2$ represents higher alkyl group with chlorine-substituted end group; and n represents a positive integer) has a conjugated double bond system in its principal chain and has a low resistivity of about $10^5$ ohms, it can prevent the charging-up due to electron. Further, since its C-S bond is readily decomposable by the action of electron beam, it can be used as a positive type resist exhibiting a high sensitivity to electron beam. Further, by introducing chlorine into the alkyl group, it becomes crosslinkable with electron beam, and hence it becomes usable as a negative type resist, too.

On the other hand, a polymeric substance (II) represented by the following general formula:

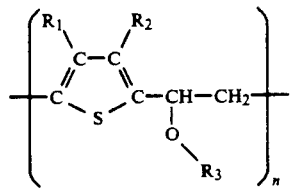

($R_1$, $R_2$ and $R_3$ represent identical or different alkyl group or hydrogen; and n represents a positive integer) exhibits no electrical conductivity. However, if heat is applied to it, the following reaction:

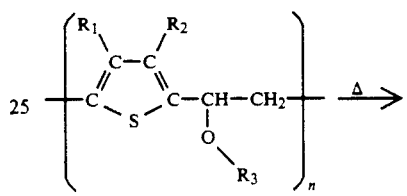

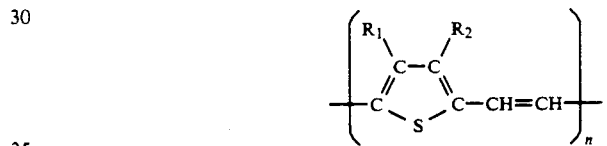

progresses, as the result of which it becomes exhibiting a high conductivity. By the use of this polymeric substance, charging-up can be prevented. Since it has C-S bonds, it can function as a positive type resist exhibiting a high sensitivity to electron beam.

Concrete example of the above-mentioned polymeric substances (I) and (II) include the followings:
polybutylthiophene,
polypentylthiophene,
polyhexylthiophene,
polyheptylthiophene,
polyoctylthiophene,
polydibutylthiophene,
polydipentylthiophene,
polydihexylthiophene,
poly[2,5-thienylene(methoxy)ethane],
poly[2,5-thienylene(ethoxy)ethane],
poly[3-butyl-2,5-thienylene(methoxy)ethane],
poly[3-hexyl-2,5-thienylene(methoxy)ethane],
polychlorobutylthiophene,
polyfluorobutylthiophene
polychloropentylthiophene,
polychlorohexylthiophene,
poly[2,5-thienylenevinylene],
precursor polymer of these compounds and their isomers and analogues.

Among these compounds, polybutylthiophene and polypentylthiophene are particularly preferable.

By using these conductive polymeric substances (I) or (II) as bottom layer film of tri-layer resist, a tri-layer resist can easily be prepared without using aluminum film, and thereby an accurate fine pattern showing no butting error nor alingment error due to charging-up can be formed.

Particularly, polyalkylthiophene type conductive polymeric substances are readily synthesizable, readily soluble into organic solvents and excellent in coating characteristics and they have a higher heat resistance than usual conductive polymer owing to the C-C principal chain, so that they are satisfactorily usable as a resist and as a bottom layer film of multilayer resist.

On the other hand, since a quaternary ammonium ion type ion conductive polymeric substance represented by the following formulas:

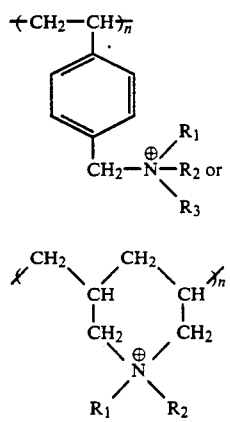

($R_1$, $R_2$ and $R_3$ represent identical or different alkyl group and n represents a positive integer) has a quaternary ammonium ion group on its side chain and exhibits a high conductivity, it can prevent the charging-up due to electron. Further, since quaternary ammonium ion functions as an electron withdrawing group, scission of the principal chain readily takes place upon exposure to electron beam. Further, since this polymer is water-soluble, water can be used as developer. Thus, this polymer can be used as a negative type resist of high sensitivity.

Further, by using these ion conductive polymeric substances in place of the aluminum film in multilayer resist, a multilayer resist can easily be prepared, and an accurate fine resist pattern having no field butting error nor alignment error due to charging-up can be formed. Particularly, quaternary ammonium ion type ion conductive polymer is excellent in heat resistance and coating characteristics, so that it is satisfactorily usable as a resist and as bottom layer film of multilayer resist.

As concrete examples of the above-mentioned quaternary ammonium ion type ion conductive polymer substance, substances having the following structures can be referred to:

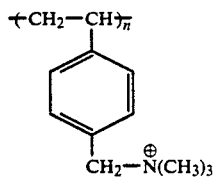

-continued

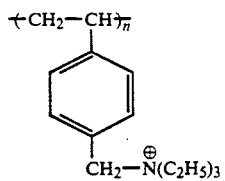

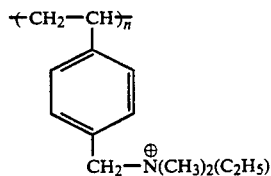

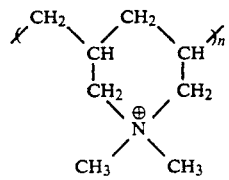

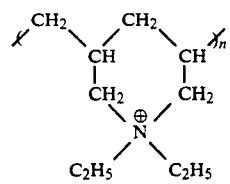

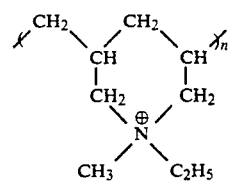

The above-mentioned polymeric substances can be formed into pattern according to generally adopted methods. One example of the method will be mentioned below.

Thus, the above-mentioned polythiophene type polymeric substance or quaternary ammonium ion type ion conductive polymeric substance is coated on a semiconductor substrate and heat-treated at 100°–200° C., whereby the solvent is thoroughly evaporated to leave behind a hard film. Onto this organic film, SOG is applied as an inorganic film and heat-treated at 100°–200° C. Further, an electron beam resist is applied onto the inorganic film and heat-treated at 100°–130° C. Then, a pattern is written on this resist by means of electron beam and it is developed, whereby an accurate fine resist pattern can be formed. Using the resist pattern as a mask, the inorganic film and polymer film are etched, whereby an accurate pattern can be formed.

EXAMPLES

Next, this invention will be illustrated more concretely by way of the following examples. This invention is by no means limited by these examples.

EXAMPLE 1

A polydibutylthiophene having a molecular weight of about 100,000 could be prepared by concentrating an ethereal solution of dibutylthiophenen monomer under reduced pressure in the presence of $FeCl_3$. After dissolving 0.1 g of this polymer into 10 cc of methylene chloride, the insoluble matter was filtered off and the filtrate was taken out as a resist solution. The resist solution was dropped onto a semiconductor substrate and spin-coated at 2,000 rpm, and the resulting film was baked at 150° C. for 30 minutes to obtain a resist film having a thickness of 1.2 microns. Then, it was exposed to electron beam at an accelerating voltage of 20 KV at a dose of $1.0 \times 10^{-5}$ C/cm$^2$, after which it was developed with a mixture of methyl isobutyl ketone (MIBK) and isopropyl alcohol (IPA). Thus, an accurate positive type resist pattern having no field butting error due to charging-up could be obtained. The loss in film thickness in the unexposed area was hardly noticeable. As the developing solution, polar solvents other than MIBK were also usable.

EXAMPLE 2

The resist film obtained in Example 1 was exposed to electron beam at an accelerating voltage of 20 KV at a dose of $5.0 \times 10^{-5}$ C/cm$^2$, and thereafter it was developed with toluene. As the result, an accurate fine negative resist pattern having no field butting error due to charging-up was obtained. As the developer, nonpolar solvents other than toluene were also usable.

EXAMPLE 3

An ethereal solution of 1-chlorobutylthiophene monomer was concentrated under reduced pressure in the presence of FeCl$_3$ to prepare poly(1-chlorobutylthiophene) having a molecular weight of about 30,000. After dissolving 0.1 g of this polymer into 10 cc of methylene chloride, the insoluble matter was filtered off and the filtrate was taken out as a resist solution.

The resist solution was dropped onto a semiconductor substrate and spin-coated at 2,000 rpm, and the resulting film was baked at 150° C. for 30 minutes to form a resist film having a thickness of 1.2 microns. Then, it was exposed to electron beam at an accelerating voltage of 20 KV at a dose of $5 \times 10^{-6}$ C/cm$^2$ and developed with toluene. As the result, an accurate negative type resist pattern having no field butting error due to charging-up was obtained.

As the solvent, nonpolar solvents other than methylene chloride were also usable. As the developer, any nonpolar solvents other than toluene were also usable.

EXAMPLE 4

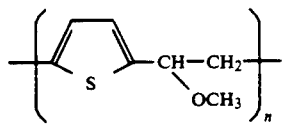

An alcoholic solution of a polymer represented by the above-mentioned formula was concentrated under reduced pressure in the presence of FeCl$_3$ to obtain a polymer having a molecular weight of about 100,000. After dissolving 0.5 g of this polymer into 50 cc of ethyl cellosolve acetate, the insoluble matter was filtered off and the filtrate was taken out as a resist solution. The resist solution was dropped onto a semiconductor substrate and spin-coated at 2,000 rpm, after which the resulting film was baked at 200° C. for 30 minutes to make progress a dehydrating reaction. As the result, a resist film having thickness of 1.2 microns was obtained. Subsequently, it was exposed to electron beam at an accelerating voltage of 20 KV at a dose of $1.0 \times 10^{-5}$ C/cm$^2$, and developed with a mixture of MIBK and IPA. As the result, an accurate positive type resist pattern having no field butting error due to charging-up was obtained. In the unexposed area, loss in thickness of film was hardly noticeable.

EXAMPLE 5

FIGS. 1(a)–1(d) illustrates the fifth example of this invention. A polymer organic film (bottom layer film 2) was formed by the coating method on a semiconductor substrate 1 and baked at 220° C. for 20 minutes. Then, SOG 3 was spin-coated thereon and baked at 200° C. for 20 minutes. Then, the polymer obtained in Example 1 was coated thereon as electron beam resist 4, and baked at 150° C. for 20 minutes to form a resist film having a thickness of 0.5 micron FIG. 1(a)). Then, it was exposed to electron beam at an accelerating voltage of 20 KV at a dose of $1 \times 10^{-5}$ C/cm$^2$ and developed with a mixture of MIBK and IPA. As the result, an accurate fine resist pattern was obtained (FIG. 1(b)). Since it had a high electrical conductivity, no field butting error due to charging-up was noticeable at all. Using this resist pattern as a mask, intermediate layer SOG 3 was etched (FIG. 1(c)). Then, using the intermediate layer as a mask, the bottom layer film 2 was etched. As the result, an accurate and vertical fine resist pattern was obtained (FIG. 1(d)). If a nonpolar solvent was used as the developer, a negative type resist pattern could be obtained. When the polymer prepared in Example 3 was used in place of the polymer of Example 1, the result obtained was similar to above.

EXAMPLE 6

FIGS. 2(a)–2(d) illustrates the sixth example of this invention. On semiconductor substrate 1, the polymer prepared in Example 4 was coated as a bottom layer film and baked at 200° C. for 30 minutes to form a polymer organic film 11. Then, SOG 12 was coated thereon and baked at 200° C. for 20 minutes. Then, further thereon, polymethyl methacrylate (PMMA) was coated as electron beam resist 13 and baked at 170° C. for 30 minutes (FIG. 2(a)). Then, it was exposed to electron beam at an accelerating voltage of 20 KV at a dose of $1 \times 10^{-4}$ C/cm$^2$ and developed with a mixture of MIBK and IPA. As the result, an accurate fine resist pattern having no field butting error due to charging-up was obtained (FIG. 2(b)). Using this resist pattern as a mask, dry etching of SOG was carried out (FIG. 2(c)). Then, using the SOG as a mask, etching of polymer organic film was carried out (FIG. 2(d)). Thus, an accurate and vertical fine resist pattern was obtained.

Figure 3:
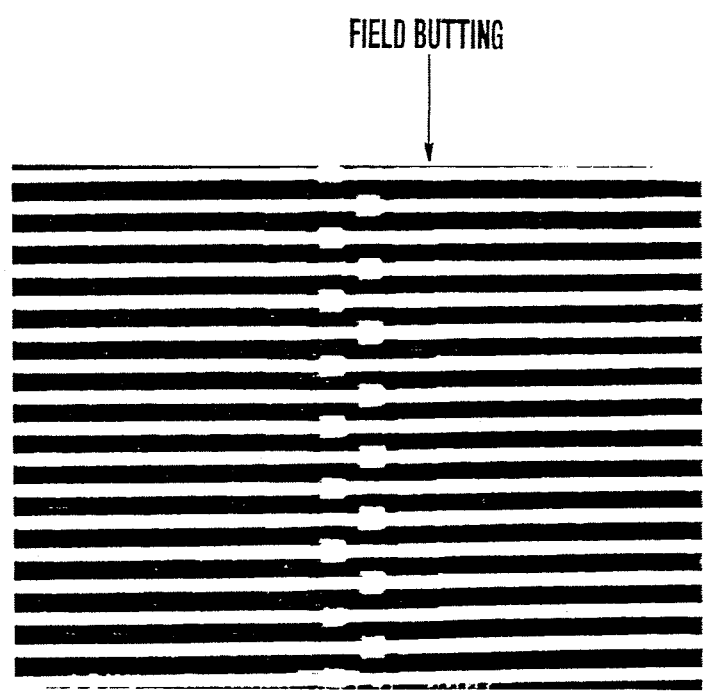
FIG. 3 is a surface SEM photograph of the pattern formed in Example 2.
Figure 5A:
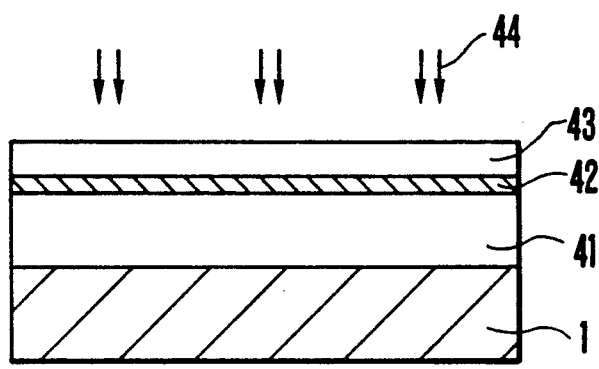
FIGS. 5(a)-5(d) is a sectional view illustrating the process of Example 10.
Figure 5B:
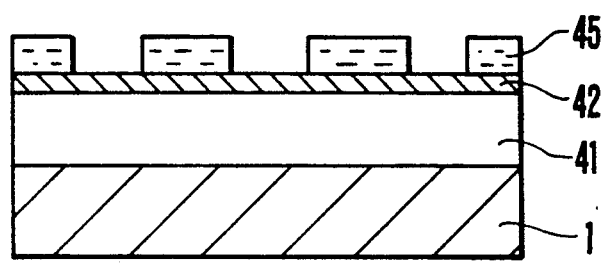
Figure 5C:
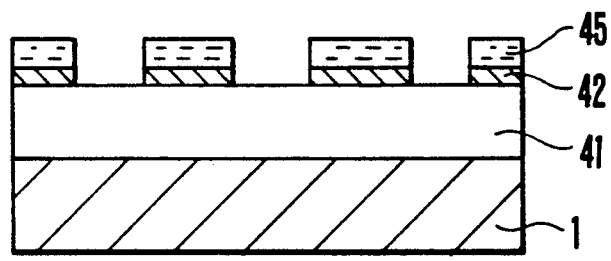
Figure 5D:
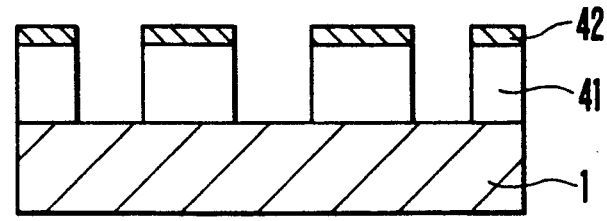
Figure 6:
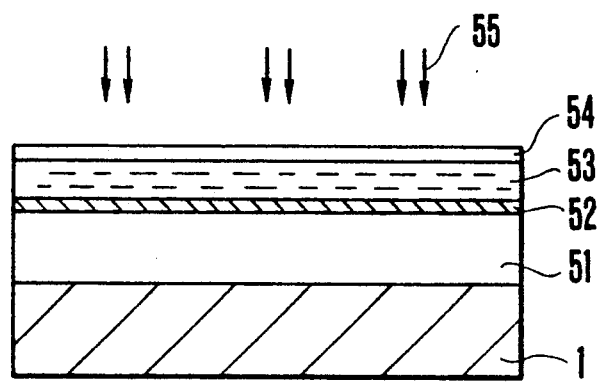
FIGS. 6(a)-6(d) is a sectional view illustrating the process of prior multi-layer resist method.
Figure 6:
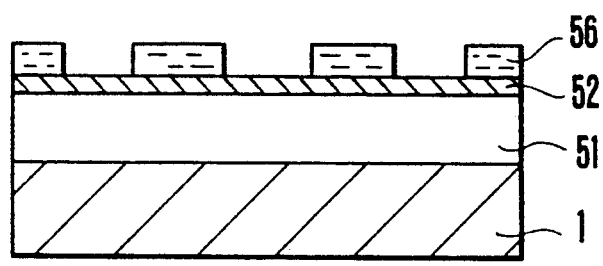
Figure 6:
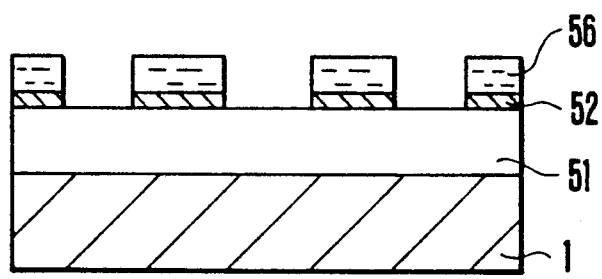
Figure 6:
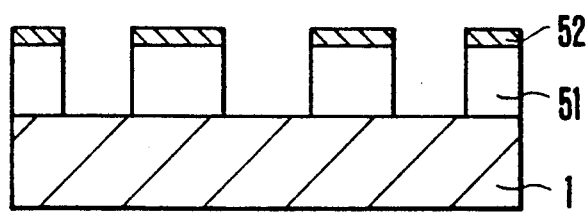
Figure 7:
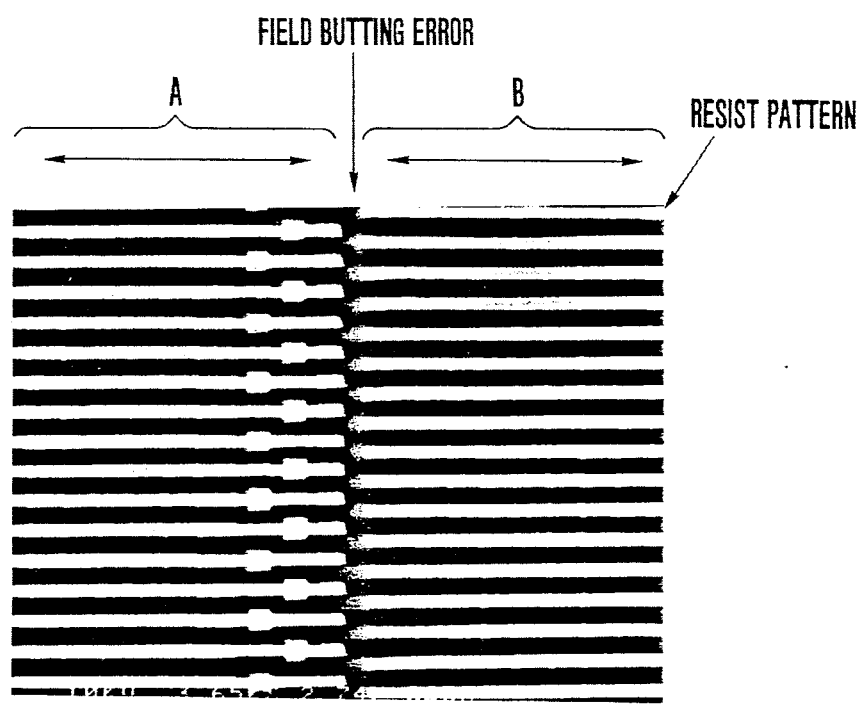
FIG. 7 is a surface SEM photograph of the pattern in prior multi-layer resist method. In the figures, the symbols denote the following parts.

FIG. 3 illustrates a surface SEM photograph of the vicinity of field butting in the pattern thus obtained. No field butting error due to charging-up effect is observable at all, and there is given an accurate fine resist pattern.

EXAMPLE 7

A polymer was synthesized by polymerizing 10 cc of p-methylstyrene at 40° C., using azobisisobutyronitrile (AIBN) as polymerization initiator. The resulting polymer was purified by reprecipitation in methanol-tetrahydrofuran system. Then, the polymer was dissolved into methyl cellosolve acetate and hydrogen atom of the methyl group was substituted with trimethylammonium to prepare a polymer of the following formula:

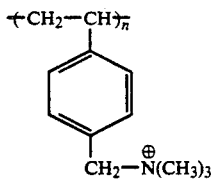

This polymer, having a molecular weight of about 100,000, was dissolved into water and the insoluble matter was filtered off. The filtrate was taken out as a resist solution. The resist solution was dropped onto a semiconductor substrate and spin-coated at 2,000 rpm and the resulting film was baked at 200° C. for 30 minutes to form a resist film having a thickness of 1.2 microns. The resist film was exposed to electron beam at an accelerating voltage of 20 KV at a dose of $1.0 \times 10^{-5}$ C/cm$^2$ and then developed with water. As the result, an accurate negative type resist pattern having no field butting error due to charging-up was obtained.

EXAMPLE 8

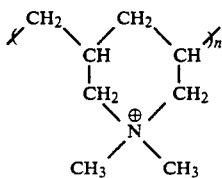

A polymer represented by the above-mentioned formula was dissolved into water. The insoluble matter was filtered off, and the filtrate was taken out as a resist solution. The resist solution was dropped onto a semiconductor substrate and spin-coated at 2,000 rpm, after which the film was baked at 200° C. for 30 minutes to prepare a resist film having a thickness of 1.2 microns. The resist film was exposed to electron beam at an accelerating voltage of 20 KV at a dose of $1 \times 10^{-5}$ C/cm$^2$ and then developed with water. As the result, an accurate negative type resist pattern having no field butting error due to charging-up was obtained.

EXAMPLE 9

FIGS. 4(a)–4(d) illustrates the ninth example of this invention. On semiconductor substrate 1, a polymer organic film was formed by the coating method as a bottom layer film 32, and it was baked at 220° C. for 20 minutes. Then, SOG 33 was spin-coated thereon and baked at 200° C. for 20 minutes. Then, fluoro polymethacrylate was spin-coated thereon as an electron beam resist 34 and baked at 180° C. for 30 minutes to form a resist film having a thickness of 0.5 micron. On the resist film, the polymer organic film 35 obtained in Example 7 was coated and baked at 150° C. for 20 minutes (FIG. 4(a)). Then, it was exposed to electron beam at an accelerating voltage of 20 KV at a dose of $5 \times 10^{-6}$ C/cm$^2$ and washed with water to remove the polymer organic film 35. Then, it was developed with a mixture of MIBK and IPA to obtain an accurate fine resist pattern (FIG. 4(b)). Since this pattern was excellent in conductivity, no field butting error due to charging-up was noticeable at all. Using this resist pattern as a mask, intermediate layer SOG (spin on glass) was etched (FIG. 4(c)). Then, using the intermediate layer as a mask, bottom layer film 32 was etched to obtain an accurate and vertical fine resist pattern (FIG. 4(d)).

EXAMPLE 10

FIGS. 5(a)–5(d) illustrates the tenth example of this invention. On semiconductor substrate 1, the polymer obtained in Example 8 was coated as a bottom layer film and baked at 200° C. for 30 minutes to form polymer organic film 41. Then, SOG 42 was coated thereon and baked at 200° C. for 20 minutes. Then, polymethyl methacrylate (PMMA) was coated thereon as an electron beam resist 43 and baked at 170° C. for 30 minutes (FIG. 5(a)). Then, it was exposed to electron beam at an accelerating voltage of 20 KV at a dose of $1 \times 10^{-4}$ C/cm$^2$ and developed with a mixture of MIBK and IPA. As the result, an accurate fine resist pattern having no field butting error due to charging-up was obtained (FIG. 5(b)). Using this resist pattern as a mask, SOG was dry-etched (FIG. 5(c)). Then, using the SOG as a mask, the polymer organic film 41 was etched (FIG. 5(d)). Thus, an accurate and vertical fine resist pattern could be obtained.

EFFECT OF THE INVENTION

As has been mentioned above, according to this invention, a positive or negative type of resist pattern having a high sensitivity and a high resolving power can be formed by using a polyalkylthiophene system, which is an electrically conductive organic polymeric substance, as an electron beam resist. It should be particularly noted that, in this invention, vapor deposition for the formation of aluminum film is unnecessary, there is no problem of contamination, the process can be simplified, the charging-up phenomenon due to electron can be prevented, and an accurate fine pattern can be formed. Further, if a quaternary ammonium ion type polymer, which is an ion conductive polymeric substance, is used as an electron beam resist, a resist pattern having a high sensitivity and a high resolving power can be formed. By using these resists, the influence of charging-up due to the writing electron can be eliminated, and field butting and overlay accuracy can be improved. Further, the vapor deposition of aluminum film is unnecessary, there is no problem of contamination and the process can be simplified. Particularly since the resists are made of a water-soluble polymer, they can be developed with water and free from the problem of contamination.

Further, by coating them on the resist of a tri-layer resist or as a bottom layer film, charging-up phenomenon can easily be prevented, by which an accurate and vertical fine resist pattern can be formed. Thus, this invention can greatly contribute to the manufacture of super high density integrated circuits.

What is claimed is:

1. A method for forming a fine pattern which comprises the steps of:
   coating on a semiconductor substrate an organic polymeric substance represented by the following general formula:

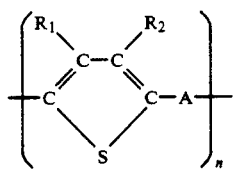

wherein $R_1$ represents alkyl group, $R_2$ represents an alkyl group identical with or different from $R_1$ or a higher alkyl having a chlorine-substituted or hydroxyl end group, A represents —CH(OR$_3$)—CH$_2$— in this case, $R_1$, $R_2$ and $R_3$ represent identical or different alkyl group or hydrogen, and n represents a positive integer, heat-treating it and thereafter coating an inorganic film on said organic polymeric substance and heat-treating it, coating an electron beam resist film onto said inorganic film and heat-treating it, writing a pattern on said resist film and developing it to form a resist pattern, and etching the inorganic film and organic polymeric substance by using said resist pattern as a mask.

2. A method for forming a fine pattern which comprises the steps of:

coating on a semiconductor substrate a polymer organic film, heating-treating it, and thereafter coating an inorganic film on said polymer organic film and heat-treating it, coating onto said inorganic film an organic polymeric substance represented by the following general formula:

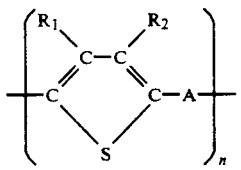

wherein $R_1$ represents alkyl group, $R_2$ represents an alkyl group identical with or different from $R_1$ or a higher alkyl having a chlorine-substituted or hydroxyl end group, A represents —CH(OR$_3$)—CH$_2$— in this case, $R_1$, $R_2$ and $R_3$ represent identical or different alkyl group or hydrogen, and n represents a positive integer, and heat-treating it, writing a pattern on said organic polymeric substance and developing it to form a pattern, and etching the inorganic film and organic polymeric film by using said pattern as a mask.

3. A method for forming a fine pattern which comprises the steps of coating on a semiconductor substrate an organic polymeric substance represented by the following general formula:

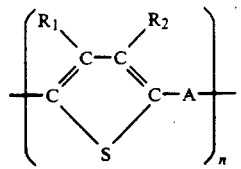

wherein $R_1$ represents alkyl group, $R_2$ represents an alkyl group identical with or different from $R_1$ or a higher alkyl having a chlorine-substituted or hydroxyl end group, A represents —CH(OR$_3$)—CH$_2$— in this case, $R_1$, $R_2$ and $R_3$ represent identical or different alkyl group or hydrogen, and n represents a positive integer, heat-treating it and writing a pattern on said organic polymeric substance and developing it to form a resist pattern.

4. A method for forming a fine pattern which comprises the steps of:

coating on a semiconductor substrate a polymer organic film, heat-treating it and thereafter coating an inorganic film on said polymer organic film and heat-treating it, coating an electron beam resist film on said inorganic film and heat-treating it, coating an organic polymeric substance represented by the following general formula to prevent the charging effect during electron beam direct writing:

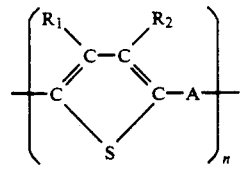

wherein $R_1$ represents alkyl group, $R_2$ represents an alkyl group identical with or different from $R_1$ or a higher alkyl having a chlorine-substituted or hydroxyl end group, A represents a straight chain or a group of the following formula:

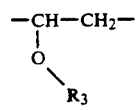

in this case, $R_1$, $R_2$ and $R_3$ represent identical or different alkyl group or hydrogen, and n represents a positive integer, onto said electron beam resist film, and heat-treating it, writing a pattern, thereafter removing said organic polymeric substance before electron beam resist development and developing the resist film to form a resist pattern, and etching the inorganic film and polymer organic film by using said resist pattern as a mask.

* * * * *